United States Patent [19]

Hillhouse

[11] 4,212,263

[45] Jul. 15, 1980

[54] PRINTING PLATE PROCESSING MACHINE

[75] Inventor: Charles R. Hillhouse, Aurora, Mo.

[73] Assignee: Tasope' Limited, Aurora, Mo.

[21] Appl. No.: 960,740

[22] Filed: Nov. 15, 1978

[51] Int. Cl.$^2$ .............................................. B05C 11/00
[52] U.S. Cl. ...................................... 118/37; 118/45;
 118/62; 118/224; 118/236; 83/405; 83/417;
 270/52; 271/4; 271/5; 271/6; 271/278;
 198/438; 198/442; 430/168; 430/270
[58] Field of Search ...................... 118/37, 50, 33, 39,
 118/62, 236, 237, 245, 249; 101/141, 143, 232,
 238; 271/4, 5, 6, 64, 213; 156/556, 558, 537

[56] References Cited

U.S. PATENT DOCUMENTS

| 2,814,398 | 11/1957 | Coleman et al. | 271/64 |
|---|---|---|---|
| 2,967,054 | 1/1961 | Glucksman | 271/5 |
| 3,288,462 | 11/1966 | Liva | 271/64 |
| 3,504,910 | 4/1970 | Spyropoulos | 271/5 |
| 3,676,978 | 7/1972 | Gottweis et al. | 198/442 |
| 3,742,903 | 7/1973 | Wheaton | 118/37 |
| 4,005,652 | 2/1977 | Petry | 101/232 |

OTHER PUBLICATIONS

Photoresist, DeForest, McGraw-Hill, N.Y., 1975, pp. 220–221.

*Primary Examiner*—J. Travis Brown
*Attorney, Agent, or Firm*—Cohn, Powell & Hind

[57] ABSTRACT

The printing plate processing machine includes a first conveyor for receiving printing plates and a second conveyor for receiving plate-separating sheets, and a feed mechanism for selectively transporting the plates and sheets from a loading station in which the plates and sheets are alternately disposed in a stack, toward the first and second conveyors. A plate and sheet diverting mechanism is located between the first and second conveyors for alternately delivering the plates to the first conveyor and the sheets to the second conveyor. The plates are processed after disposition on the first conveyor. A collecting station received the plates and sheets from the first and second conveyors alternately in a stack after processing of the plates. The feed-mechanism includes a fluid-operated cylinder and ram, the ram being movable selectively between an extended position and a retracted position. An operating mechanism places a gripping mechanism, carried on the ram, into gripping engagement with the plates and sheets when the ram is in one of the positions, the gripping mechanism transporting the plates and sheets toward the first and second conveyors as the ram moves toward the other position. The diverting mechanism includes a passage having an entrance between the loading station and the first conveyor, and having an exit communicating with the second conveyor. A baffle is rotatively mounted at the passage entrance, the baffle being selectively located in one position to effectively close the passage entrance and direct plates on to the first conveyor, and selectively located in another position to effectively open the passage entrance for movement of the sheets through the passage entrance and on to the second conveyor. A blower is located above the passage entrance and the baffle for discharging an air stream against the sheets and the baffle to move the baffle to its other position to effectively open the passage entrance and for urging the sheets through the passage entrance and passage, and on to the second conveyor.

10 Claims, 10 Drawing Figures

PRINTING PLATE PROCESSING MACHINE

BACKGROUND OF THE INVENTION

In the heretofore conventional printing plate processing machines in which the plates are punched or coated, the plates are fed manually into the machine, and after processing, the plates were then removed from the machine and stacked manually. In some prior known machines, the plates were fed automatically into the plate processing machine and then discharged into a stack. However, in these prior machines, the plate-separating sheets were handled separately and manually.

SUMMARY OF THE INVENTION

This invention relates generally to a printing plate processing machine, and more particularly to an improved machine of this type in which the printing plates and plate-separating sheets are fed automatically into the machine from a stack in which the plates and sheets are alternately disposed, and then separated in the machine so that the plates can be processed, and then discharged in a stack in which such plates and sheets are again alternately disposed after the plates have been processed.

The present printing plate processing machine includes a loading station for receiving a stack of alternately disposed printing plates and plate separating sheets, and feed means for transporting the plates and sheets from the loading station toward the first and second conveyor means. A plate and sheet diverting means between the first and second conveyor means alternately delivers the plates to the first conveyor means and the sheets to the second conveyor means. A plate-processing means processes the plates after disposition on the first conveyor means. A collecting station receives the plates and sheets from the first and second conveyor means alternately in a stack after processing of the plates.

In one aspect of the printing plate processing machine, the feed means includes a fluid-operated cylinder and ram, the ram being movable selectively between and extended position and a retracted position. An operating means places the plate and sheet gripping means carried on the ram into gripping engagement with the plates and sheets when the ram is in one of the said positions, the gripping means transporting the plates and sheets toward the first and second conveyor means as the ram moves toward the other said position. More particularly in the preferred embodiment, the operating means places the gripping means into gripping engagement with the plates and sheets when the ram is in the extended position, and transports the plates and sheets toward the first and second conveyor means as the ram moves toward the retracted position. The operating means releases the gripping means from the plates and sheets when the ram is in the retracted position.

In one aspect of the plate processing machine, the diverting means includes a blower that discharges an air stream against the sheets to urge the sheets on to the second conveyor means.

In one aspect of the plate processing machine, the diverting means includes a baffle selectively located in one position for directing the plates on to the first conveyor means, and selectively located in another position for enabling movement of the sheets on to the second conveyor means.

In one aspect of the plate processing machine, the diverting means includes a passage having an entrance between the loading station and the first conveyor means, and having an exit communicating with the second conveyor means. A baffle is rotatively mounted on a rotative axis substantially at the passage entrance, the baffle being selectively located in one position to effectively close the passage entrance and direct the plate on to the first conveyor means, and selectively located in another position to effectively open the passage entrance for enabling movement of the sheets through the passage entrance and on to the second conveyor means.

BRIEF DESCRIPTION TO THE DRAWINGS

DESCRIPTION OF THE PREFERRED EMBODIMENT

Figure 1:
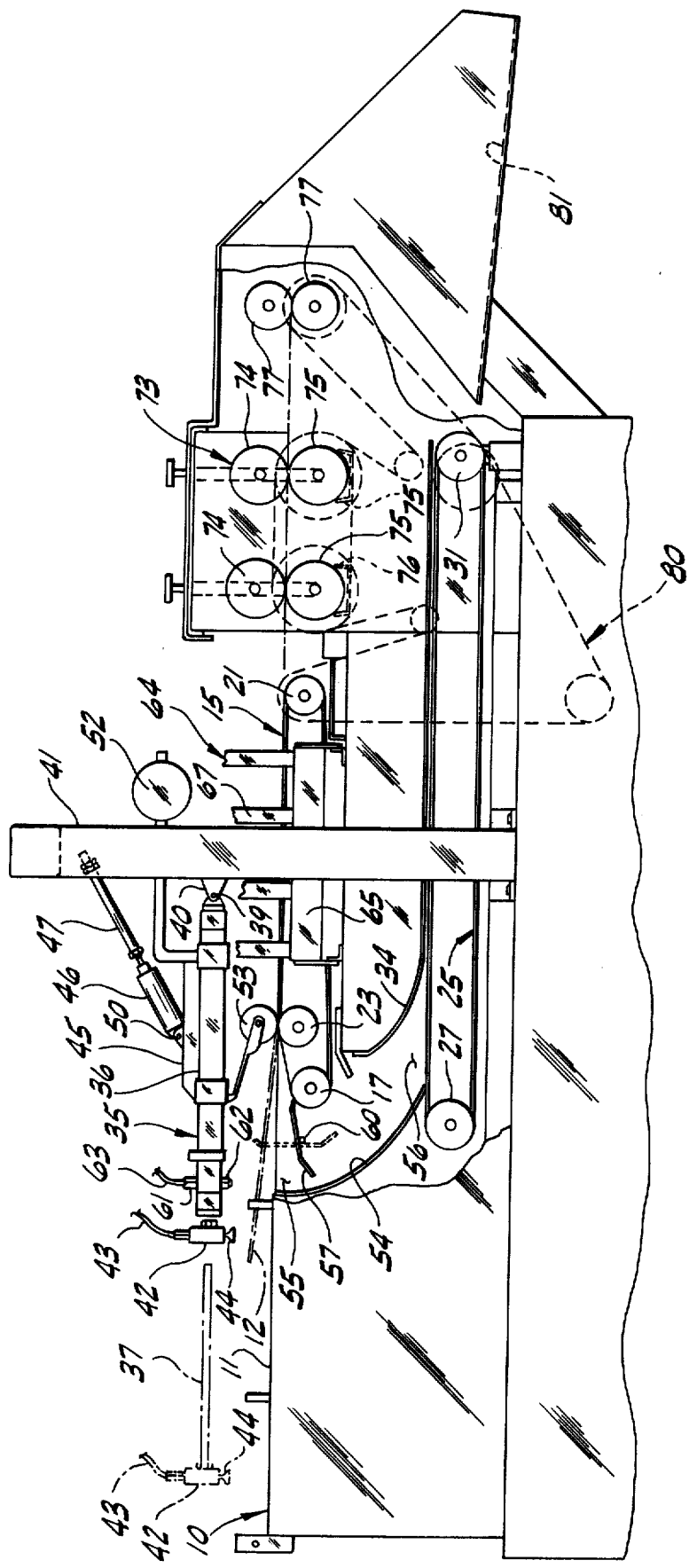
FIG. 1 is a side elevational view of the printing plate processing machine, partially cut-away to show the operating mechanism.
Figure 2:
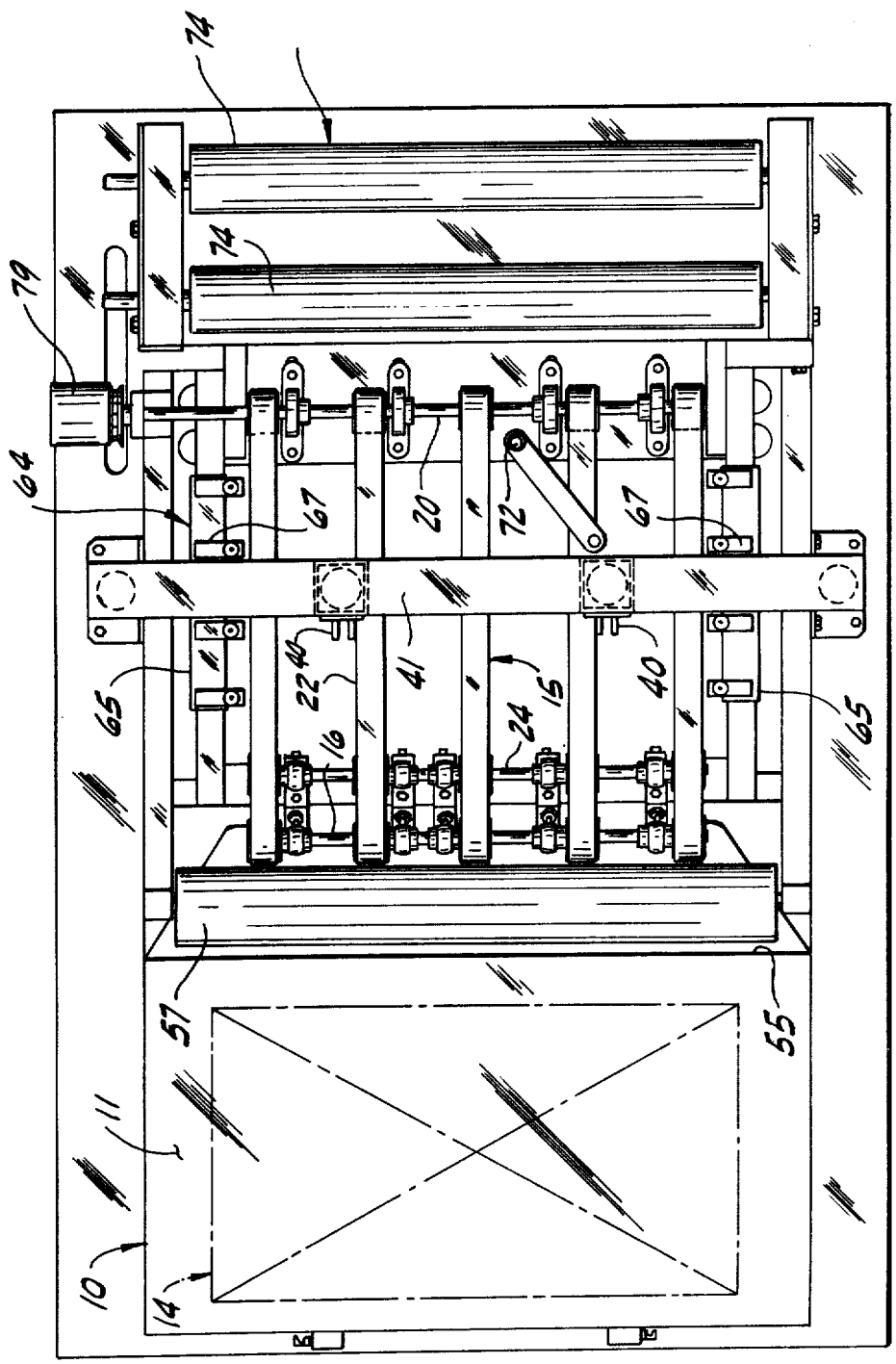
FIG. 2 is a top plan view of the machine shown in FIG. 1, with the feed means removed and the housing over the coating rollers removed for clarity.

Referring now by characters of reference to the drawings, and first to FIG. 1, it will be understood that the printing plate processing machine includes a loading station 10 on top of platform 11 on which a stack 14 of alternately disposed printing plates 12 and plate-separating sheets 13 are disposed, as is best shown in FIGS. 5A-5F. The stack of plates 12 and sheets 13 is shown diagrammatically in FIG. 2.

Figure 3:
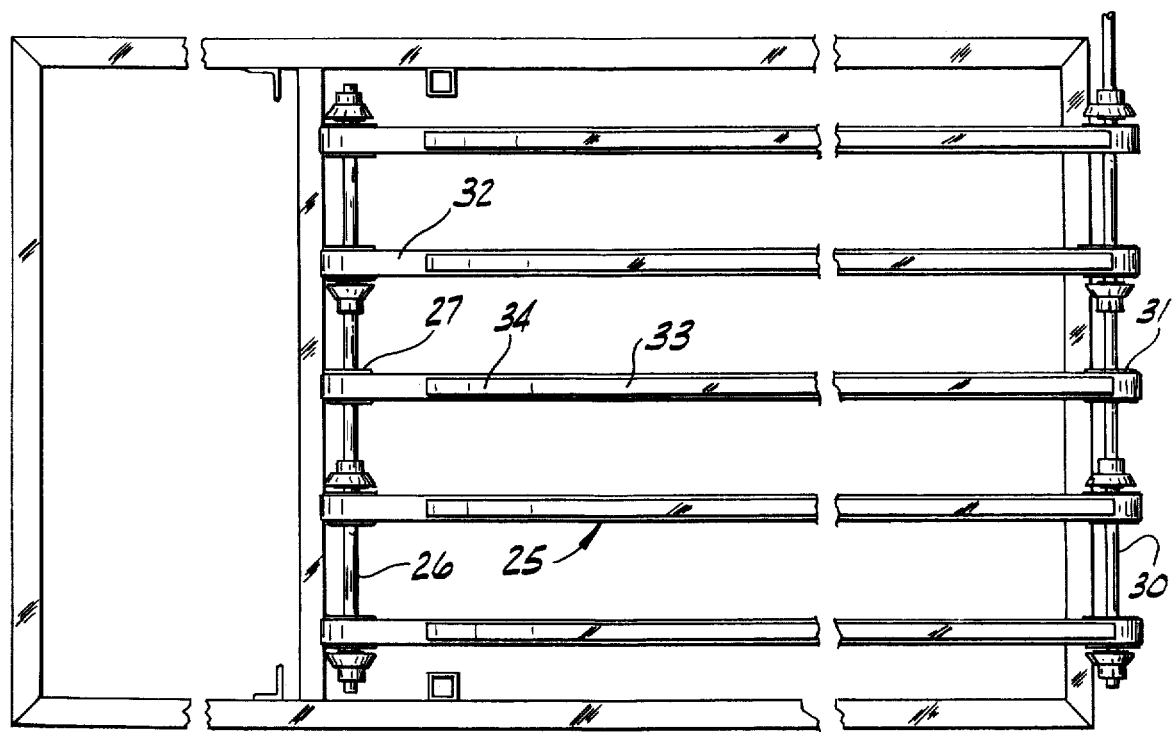
FIG. 3 is a top plan view of the second conveyor means on which the plate-separating sheets are disposed and transported.
Figure 4:
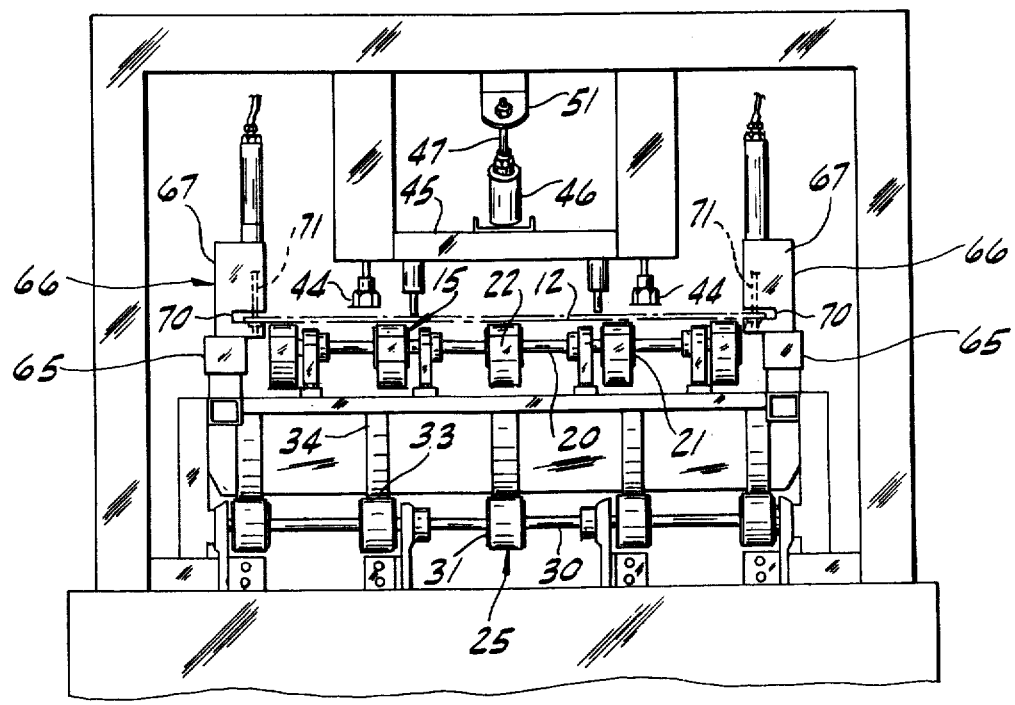
FIG. 4 is an end view of the two conveyors as seen from the right of FIG. 1, and FIGS. 5A-5F are a series of diagrammatic views illustrating the sequence of operation.

Located operatively downpath of the loading station 10, is a first conveyor means referred to by 15. The conveyor means 15 in FIG. 3 includes a transverse front shaft 16 on which a plurality of axially spaced rollers 17 are drivingly connected. A transverse rear shaft 20 is provided with a plurality of axially spaced rollers 21 aligned with the compatible front rollers 17. These aligned and compatible rollers 17 and 21 receive and drive a plurality of laterally spaced conveyor belts 22. For reasons which will later appear, the upper span of the first conveyor belts 22 are supported below and closely adjacent to the front roller 17 by a plurality of support rollers 23 carried on a transverse shaft 24.

A second conveyor means indicated generally by 25 is located below and in spaced relation to the first conveyor means 15. This second conveyor means 25 includes a transverse front shaft 26 on which a plurality of rollers 27 are drivingly connected and mounted in axially spaced relation. A transverse rear shaft 30 is provided on which a plurality of compatible rollers 31 are driving mounted in axially spaced relation and in alignment with the compatible front rollers 27. Disposed on and carried by the aligned and compatible front and rear rollers 27 and 31, are a plurality of conveyor belts 32. The second conveyor means 25 is longer than and extends beyond the rear end of the first conveyor means 15.

Disposed over the upper spans of the second conveyor belts 32, are elongate guide strips 33. These cooperating guide strips 33 and second conveyor belts 32 are slightly spaced so as to receive the plate-separating sheets 13 therebetween when such sheets 13 are disposed on the second conveyor means 25, the guide strips 33 providing sufficient friction so that the sheets 13 can be transported by and discharged from the second conveyor belts 32. The elongate guide strips 33 are provided with upwardly curved front ends 34 to facilitate movement of the sheets 13 between the strips 33 and second conveyor belts 32 when the sheets 13 are disposed on the second conveyor means.

A feed means referred to by 35 is provided for selectively transporting the plates 12 and sheets 13 from the loading station 10 toward the first and second conveyor means 15 and 25. This feed means 35 includes a pair of fluid-operated cylinders 36 and rams 37 disposed in laterally spaced relation over the loading station 10 and the front end portion of the first conveyor means 15. The cylinders 36 have one end pivotally mounted by pins 39 to laterally spaced brackets 40 attached to a machine frame 41. The rams 37 are movable selectively between an extended position shown in broken lines in FIG. 1 to a retracted position illustrated in full lines in FIG. 1.

The outer ends of the rams 37 are provided with heads 42 that carry vacuum lines 43 operatively connected to suction cups 44, constituting gripping means, that are movable into gripping engagement with plates 12 and sheets 13 when the rams 37 are disposed in the extended position.

The cylinders 36 are operatively connected so as to pivotally move simultaneously as a unit by a transverse frame 45. Another cylinder 46 and ram 47 is provided to pivotally move the cylinders 36 and rams 37 upwardly and downwardly incident to moving the suction cups 44 into gripping engagement with the plates 12 and sheets 13. The cylinder 46 is pivotally connected by pin 50 to the transverse cylinder frame 45, and the end of ram 47 is pivotally connected to bracket 51 attached to the machine frame 41.

A counterbalance 52 is attached to each of the cylinders 36, and is located on the opposite side of the pivot pin 39 so as to tend to raise the cylinders 36 and rams 37.

Attached to the underside of the transverse cylinder frame 45 is a pressure roller 53 that is adapted to engage the top of the centrally located, first conveyor belt 32 immediately above its associated roller 23. The pressure roller 53 enables movement of the printing plate 12 on to the first conveyor belts 32, and provides sufficient friction so that the first conveyor belts 32 will transport the plates 12 to a plate-processing position which will be later described.

The plate and sheet diverting means between the first and second conveyor means 15 and 25 for alternately delivering the plates 13 to the first conveyor means 15 and the sheets 13 to the second conveyor means 25, includes a passage 54 having an entrance 55 between the loading station 10 and the front of the first conveyor means 15, and having an exit 56 communicating with the front of the second conveyor means 25. An elongate baffle 57 is rotatively mounted on a rotative axis 60 substantially at the passage entrance 55. The baffle 57 is selectively located in one position shown in full lines in FIG. 1 to effectively close the passage entrance 55 and direct plates 13 on to the first conveyor means 15, and is selectively located in another position shown in broken lines in FIG. 1 to effectively open the passage entrance 55 for enabling movement of the sheets 13 through the passage entrance 55 and on to the second conveyor means 25.

A blower 61 having a nozzle 62 and an air line 63 is carried by each of the cylinders 36. The blower nozzles 62 are located above the passage entrance 55 and the baffle 57 for discharging air streams against the sheets 13 and the baffle 57 at one side of the rotative axis 60 to move the baffle 57 to its other position in which the passage entrance 57 is effectively open, and to urge the sheets 13 through the passage entrance 57, through the passage 54, and on to the second conveyor means 25.

The machine includes a first plate-processing station whereby the plates 12 are punched along their side edges to provide register holes. The punching assembly generally indicated by 64 includes side rails 65 along opposite sides of the first conveyor means 15, and a plurality of punches 66 mounted on the side rails 65 in longitudinally spaced relation. Each punch 66 includes a body 67 having a side opening slot 70 for receiving the side edge of the printing plate 12 as it is transported by the first conveyor means 15. A pneumatically operated punching rod 71 is carried in the body 67, and is adapted to punch the register hole in the plate side edge located in the slot 70.

The front edge of the printing plates 12 engage solenoid operated positioning pin 72 which is normally extended to locate the plates 12 in appropriate position in the punch assembly 64 at the first plate-processing station. When the plates 12 have been punched, the positioning pin 72 is retracted to permit the processed plates 12 to be transported further by the first conveyor means 15.

This machine can be utilized to process either lithographic plates or photopolymer plates. In those instances in which the lithographic plates are being processed, a second plate-processing station is provided for applying a diazo light-sensitive material as a coating on both sides of the plates.

The coater assembly referred to by 73 is located behind the rear end of the first conveyor means 15. This coater assembly 73 includes two sets of coating rollers 74 and 75 between which the printing plates 12 are passed as the plates 12 are discharged from the first conveyor means 15. The lower rollers 75 revolve in trays 76 containing the light-sensitive coating material. As the printing plates 12 move between the cooperating sets of rollers 74 and 75, a coating is applied to the opposite sides of the plates 12, and the coated plates 12 are then discharged to a pair of pressure rollers 77.

A drive assembly referred to as 80 and shown diagrammatically in FIG. 1, operatively interconnects motor 79 with the first conveyor means 15, the second conveyor means 25, the coating rollers 75 and discharge pressure rolls 77. As is conventional this drive assembly 80 can consist of belt-pulley elements or chain-sprocket elements.

Located behind the coater assembly 73 and behind the end pressure rolls, 77, is a collecting station 81 for receiving the plates 12 and sheets 13 from the first and second conveyor means 15 and 25 alternately in a stack after processing of the plates 12.

It is thought that the usage and operation of the plate processing machine has become apparent from the foregoing detailed description of parts, but for completeness of disclosure, such operation will be briefly described.

From FIGS. 5A–5F, it will be assumed that a stack 14 of alternately disposed plates 12 and sheets 13 is located at the loading station 10. Initially, the rams 37 are located in their retracted position, and the baffle 57 is located in its position to effectively close the passage entrance 55 and to engage the upper span of the first conveyor belts 32.

Figure 5A:
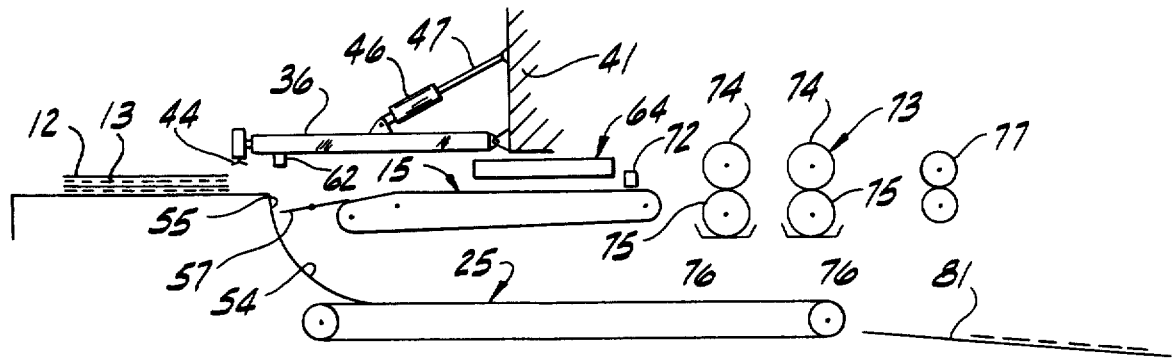
Figure 5B:
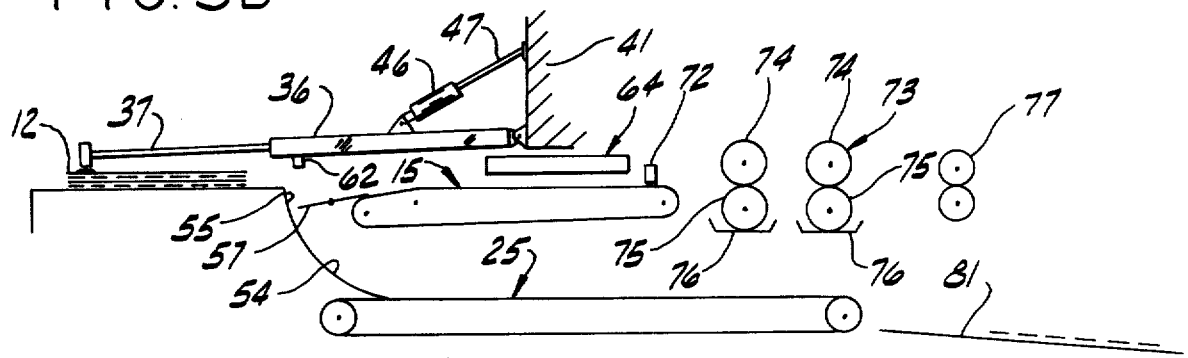
Figure 5C:
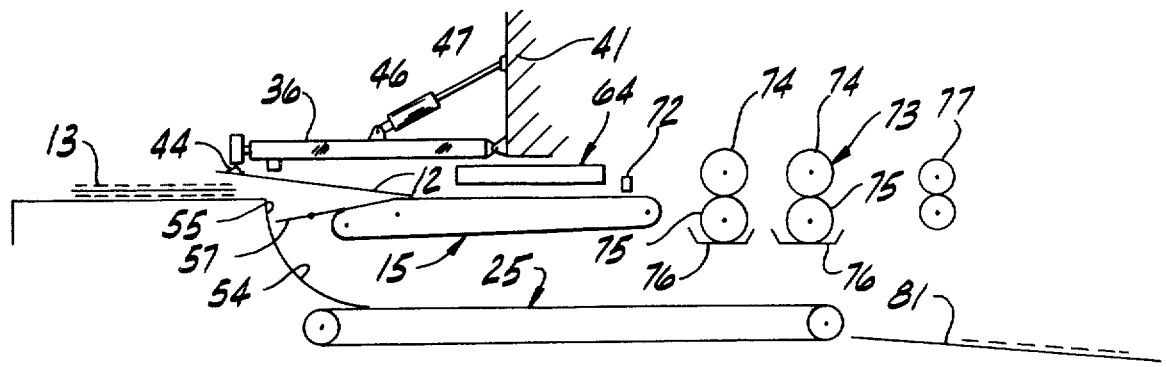

First, the cylinders 36 are actuated to extend the rams 37 from the retracted position shown in FIG. 5A to an extended position over the printing plate 12 on the top of the stack 14 at the loading station 10. Then the cylinder 46 is actuated to pivot the cylinders 36 and rams 37 downwardly about the pivot pins 39 in order to bring the suction cups 44 down into engagement with the top printing plate 12. Simultaneously, the vacuum line 43 is activated so that the suction cups 44 will grip and retain the top plate 12. Then, the cylinder 46, is activated to pivot the cylinders 36 and rams 37 upwardly about their pivot pins 39, while the suction cups 44 grip and raise the front end of the top printing plate 12. The cylinders 36 are then actuated to bring the rams 37 back to their retracted position illustrated in FIG. 5C. During this retracting movement of the rams 37, the suction cups 44 carry and push the printing plate 12 over the baffle 57 and on to the first conveyor means 15. The vacuum line 43 is deactivated so that the suction cups 44 release the printing plate 12, and the first conveyor means 15 carries the printing plate 12 to the first processing station as determined by the engagement of the plate with the positioning pin 72, and in which the printing plate 12 is directly and operatively associated with the punch assembly 64 as is illustrated in FIG. 5D.

Figure 5D:
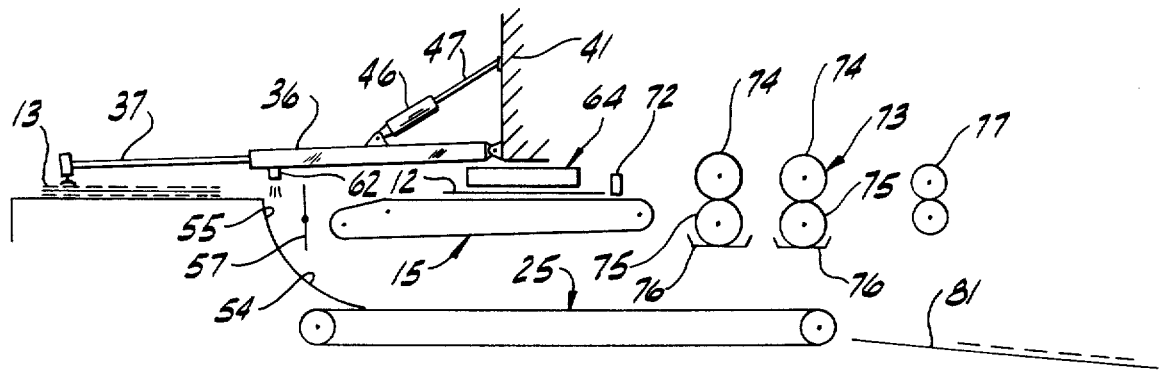

While the punches 66 of the punch assembly 64 are processing the printing plate 12 at the first processing station by punching suitable register holes in the plate side edges, the cylinders 36 are again actuated to extend the rams 37, and the cylinder 46 is again subsequently actuated to pivot the cylinders 36 and rams 37 downwardly to bring the suction cups 44 into direct engagement with the front end of the top plate-separating sheet 13, in stack 14 as illustrated in FIG. 5D. Again, the vacuum line 43 is activated so that the suction cups 44 will grip the top sheet 13. The cylinder 46 is then actuated to pivot the cylinders 36 and rod 37 upwardly so that the suction cups 44 lift the front end of sheet 13. As the cylinders 36 are actuated to retract the rams 37 the suction cups 44 will carry and push the sheet 13 over the passage entrance 55.

Simultaneously with the initiation of this retracting movement of rams 37, the lower nozzles 62 will discharge air streams into engagement with one side of the rotatively mounted baffle 57 so as to rotate the baffle into a position to open the passage entrance 55 as illustrated in FIG. 5D. As the sheet 13 is moved over the passage entrance, the air streams from the lower nozzles 62 engage the sheet 13 and urge the sheet 13 through the passage entrance 55 and into passage 54, and on to the second conveyor means 25, while at the same time holding the baffle 57 in its open position, as is illustrated in FIG. 5E.

Figure 5E:
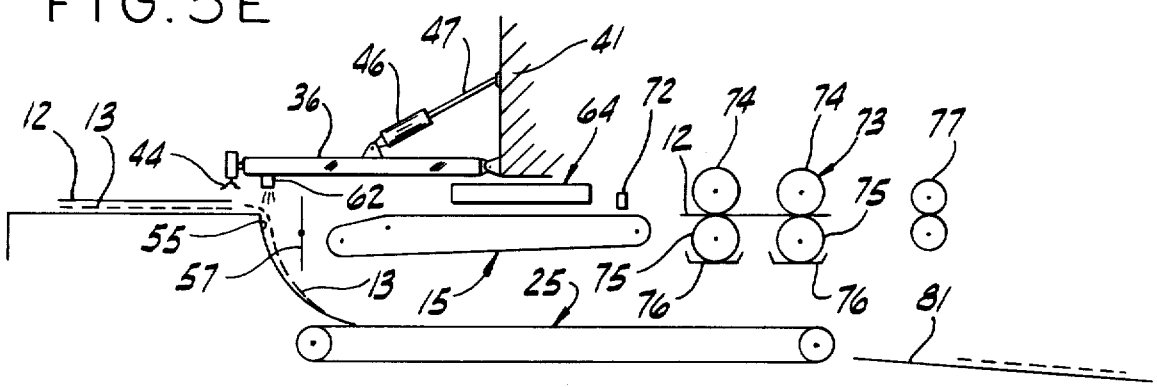

While the plate-separating sheet 13 is being fed on to the second conveyor means 25, the printing plate 12 has been punched by the punch assembly 64 and has been transported by the first conveyor means 15 into and between the sets of coating rollers 74–75 as illustrated in FIG. 5E. The rollers 74–75 will apply a light-sensitive coating on opposite sides of the plate 12. After the plate 12 has been coated, it is moved through the pressure rollers 77 and is discharged into the collecting station 81.

Figure 5F:
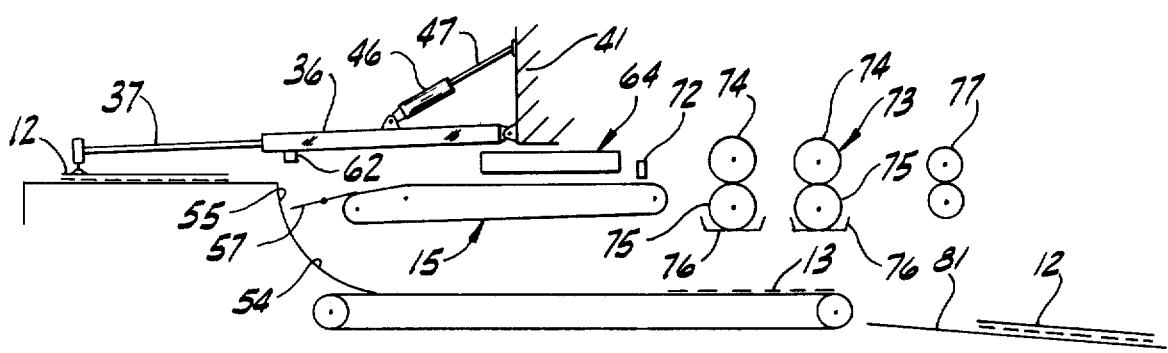

After the plate-separating sheet 13 is delivered on to the second conveyor means 25, the air streams from the blower nozzles 62 is terminated, thereby allowing the unbalanced weight of the baffle 57 to automatically rotate the baffle 57 to its closed position with respect to the passage entrance 55 and on to the upper span of the first conveyor means 15 as illustrated in FIG. 5F. The feed means 35 is then again activated in the sequence described previously to pick up and deliver the next printing plate 12 from the stack 14 at the loading station 10. While this subsequent feeding procedure is being accomplished, the plate-separating sheet 13 is being transported by the second conveyor means 25 and discharged into the collecting station 81 on top of the previously processed printing plate 12. It will be understood that the processed plates 12 and associated plate-separating sheets 13 are disposed automatically and sequentially in alternately disposed relation in a stack at the collecting station.

I claim as my invention:

1. In a printing plate processing machine:
   (a) a loading station for receiving a loading stack of alternately disposed printing plates and plate-separating paper sheets,
   (b) a first conveyor means for receiving the printing plates,
   (c) a second conveyor means for receiving the plate-separating paper sheets,
   (d) feed means selectively transporting the plates and paper sheets alternately from the loading stack toward the first and second conveyor means,
   (e) plate and paper sheet diverting means between the first and second conveyor means for alternately delivering the plates to the first conveyor means and the paper sheets to the second conveyor means,
   (f) plate-processing means for processing the plates after disposition on the first conveyor means, and
   (g) a collecting station for receiving the same plates and same paper sheets from the first and second conveyor means respectively and for disposing the plates and paper sheets alternately in a single collecting stack after processing of the plates.

2. A printing plate processing machine as defined in claim 1, in which:
   (h) the feed means includes:
      1. a fluid-operated cylinder and ram, the ram being movable selectively between an extended position and a retracted position,
      2. plate and paper sheet gripping means carried on the ram, and
      3. operating means placing the gripping means selectively and alternately into gripping engagement with the plates and paper sheets in the loading stack when the ram is in one of said positions, the gripping means transporting the plates and paper sheets alternately from the loading stack and toward the first and second conveyor means as the ram moves toward the other said position.

3. A printing plate processing machine as defined in claim 1:
   (h) the feed means includes a first fluid-operated cylinder and ram, the cylinder being pivotally mounted and the ram being movable selectively between an extended position over the stack of plates and paper sheets at the loading station, and a retracted position, (i) plate and sheet gripping means carried on the ram, and (j) a second fluid-operated cylinder and ram operatively connected to the said first cylinder for pivoting the first cylinder and moving the gripping means selectively and alternately into gripping engagement with the plates and paper sheets when the ram is in the extended position, the gripping means transporting the plates and paper sheets alternately from the loading stack and toward the first and second conveyor means as the ram moves toward the retracted position, the gripping means being releasable from the plates and paper sheets when the ram is in the retracted position.

4. A printing plate processing machine as defined in claim 1, in which:

(h) the diverting means includes a baffle selectively located in one position for directing plates on to the first conveyor means, and selectively located in another position for enabling movement of the paper sheets on to the second conveyor means, and (i) the diverting means includes a blower selectively discharging an air stream against the baffle to move the baffle to said other position.

5. A printing plate processing machine as defined in claim 4, in which:

(j) the blower selectively discharges the same air stream against the paper sheets to urge the paper sheets past the baffle when in said other position and on to the second conveyor means.

6. A printing plate processing machine as defined in claim 3, in which:

(h) the diverting means includes a baffle selectively located in one position for directing plates on to the first conveyor means, and selectively located in another position for enabling movement of the paper sheets on to the second conveyor means, (i) the diverting means includes a blower selectively discharging an air stream against the baffle to move the baffle to said other position, and (j) the blower is carried by the first cylinder.

7. A printing plate processing machine as defined in claim 1, in which:

(h) the first conveyor means and second conveyor means are relatively spaced, (i) the diverting means includes:
 1. a passage having an entrance between the loading station and the first conveyor means, and having an exit communicating with the second conveyor means, and
 2. a baffle rotatively mounted on a rotative axis substantially in the passage entrance, the baffle being selectively located in one position to effectively close the passage entrance and direct the plates on to the first conveyor means, and selectively located in another position to effectively open the passage entrance for movement of the paper sheets through the passage entrance and on to the second conveyor means, (j) the baffle engages and directs the sheets through the passage entrance, and (k) the diverting means include a blower located above the passage entrance and the baffle for discharging an air stream against both the paper sheets and the baffle at one side of the rotative axis to move the baffle to the other position to effectively open the passage entrance, and to urge the paper sheets through the passage entrance and passage, and on to the second conveyor means.

8. A printing plate processing machine as defined in claim 7, in which:

(l) the baffle is counterbalanced to move to the said one position when the air stream from the blower against the baffle is selectively terminated.

9. A printing plate processing machine as defined in claim 7, in which:

(l) the feed means includes:
 1. a fluid-operating cylinder and ram, the ram being movable selectively between an extended position and a retracted position,
 2. plate and sheet gripping means carried on the ram, and
 3. operating means placing the gripping means selectively and alternately into gripping engagement with the plates and paper sheets when the ram is in the extended position, the gripping means transporting the plates and paper sheets alternately from the loading stack toward the first and second conveyor means as the ram moves toward the retracted position, and releasing the gripping means from the plates and paper sheets when the ram is in the retracted position, and (m) the blower is carried by the fluid operated cylinder and discharges an air stream selectively against the paper sheets as the paper sheets are transported by the gripping means from the loading station as the ram moves toward the retracted position.

10. A printing plate processing machine as defined in claim 1, in which:

(h) the feed-means includes:
 1. a first fluid-operated cylinder and ram, the cylinder being pivotally mounted, and the ram being movable selectively between and extended position over the stack of alternately disposed plates and paper sheets at the loading station, and a retracted position,
 2. plate and sheet gripping means carried on the ram, and
 3. a second fluid-operated cylinder and ram operatively connected to the said first cylinder and ram for pivoting the first cylinder and ram and placing the gripping means selectively and alternately into gripping engagement with the plates and paper sheets in the loading stack when the ram is in the extended position, and for pivoting the first cylinder and ram for raising the gripped plates and paper sheets alternately from the loading stack, the gripping means transporting the plates and paper sheets from the loading stack and toward the first and second conveyor means as the ram of the first cylinder and ram moves toward the retracted position, and the gripping means selectively releasing the plates and paper sheets when the ram of the first cylinder ram is in the retracted position.

(i) the first conveyor means is located in spaced relation above the second conveyor means, (j) the diverting means includes:
 1. a passage having an entrance between the loading station and the first conveyor means, and having an exit communicating with the second conveyor means, 2. a baffle rotatively mounted on a rotative axis substantially at the passage entrance, the baffle being selectively located in one rotated position to effectively close the passage entrance and direct plates on to the first conveyor means as the ram of the first cylinder and ram moves toward the retracted position, and selectively open the passage entrance and for movement of the paper sheets through the passage entrance and on to the second conveyor means as the ram of the first cylinder and ram moves toward its retracted position, and 3. a blower carried by the cylinder of the first cylinder and ram and located above the entrance passage and baffle for discharging an air stream against both the paper sheets and the baffle at one side of the rotative axis to move the baffle to the said other rotated position to effectively open the passage entrance and for urging the paper sheets through the passage entrance and the passage, and on to the second conveyor means as the paper sheets are transported by the gripping means from the loading station as the ram of the first cylinder and ram moves toward the retracted position.

* * * * *